US006675034B2

(12) United States Patent
Sussman et al.

(10) Patent No.: US 6,675,034 B2
(45) Date of Patent: Jan. 6, 2004

(54) MAGNETIC RESONANCE IMAGING USING DIRECT, CONTINUOUS REAL-TIME IMAGING FOR MOTION COMPENSATION

(75) Inventors: Marshall S. Sussman, Toronto (CA); Graham A. Wright, Toronto (CA); Charles H. Cunningham, Toronto (CA)

(73) Assignee: Sunnybrook and Women's Health Sciences Centre, Toronto (CA)

( * ) Notice: Subject to any disclaimer, the term of this patent is extended or adjusted under 35 U.S.C. 154(b) by 0 days.

(21) Appl. No.: 09/837,185

(22) Filed: Apr. 19, 2001

(65) Prior Publication Data

US 2003/0088174 A1 May 8, 2003

(51) Int. Cl.[7] .................................................. A61B 5/05
(52) U.S. Cl. ...................................................... 600/410
(58) Field of Search ................................ 600/410, 415, 600/419, 300, 413; 324/309, 310; 345/428

(56) References Cited

U.S. PATENT DOCUMENTS

| | | | | |
|---|---|---|---|---|
| 4,607,642 A | * | 8/1986 | Powers | 600/455 |
| 5,287,854 A | * | 2/1994 | Leunbach | 600/410 |
| 5,541,512 A | | 7/1996 | Dumoulin et al. | |
| 5,553,621 A | * | 9/1996 | Otterson | 600/453 |
| 5,600,138 A | * | 2/1997 | Colson et al. | 250/330 |
| 5,621,519 A | * | 4/1997 | Frost et al. | 356/124.5 |
| 5,677,892 A | * | 10/1997 | Gulunay et al. | 367/38 |
| 5,905,377 A | | 5/1999 | Kerr et al. | |
| 6,067,465 A | | 5/2000 | Foo et al. | |
| 6,144,873 A | * | 11/2000 | Madore et al. | 600/410 |
| 6,184,682 B1 | | 2/2001 | Ehman et al. | |
| 6,198,959 B1 | | 3/2001 | Wang | |
| 6,201,393 B1 | | 3/2001 | Bernstein et al. | |
| 6,289,232 B1 | * | 9/2001 | Jakob et al. | 600/410 |
| 6,459,430 B1 | * | 10/2002 | Kusumo | 345/428 |

OTHER PUBLICATIONS

Stainsby, Jeffrey A., et al., "Realtime MR with Physiological Monitoring for Improved Scan Localization".
"A New Anterior Cardiac Phased Array Coil for High–Resolution Coronary Artery Imaging".
Hardy, Christopher J., et al., "Coronary Angiography by Real–Time MRI with Adaptive Averaging," Magnetic Resonance in Medicine 44:940–946, 2000.
Bailes, D., et al., Journal of Computer Assisted Tomography, vol. 9, pp. 835–838, 1985.
Cunningham, C., et.al., Magnetic Resonance In Medicine, vol. 42, p. 577–584, 1999.
Ehman, R., et al., Radiology, vol. 173 pp. 255–263, 1989.
Griswold, M., et.al., 6th Proceeding, ISMRM, p. 423, 1998.
Hardy, C., et.al., 6th Proceeding, ISMRM, p. 22, 1998.
Hardy, C., et.al., 7th Proceeding, ISMRM, p. 231, 1999.
K. Nehrke, et.al., 8th Proceeding, ISMRM, p. 404, 2000.
Kerr, A., Magnetic Resonance In Medicine, vol. 38, pp. 355–367, 1997.
Khadem, R., et.al., 5 MRM, vol. 38, p. 346, 1994.

(List continued on next page.)

Primary Examiner—Daniel Robinson
(74) Attorney, Agent, or Firm—Miles & Stockbridge PC; Edward J. Kondracki; Leslie L. Coulson

(57) ABSTRACT

Magnetic resonance imaging (MRI) uses direct, continuous, unaliased, real-time imaging for motion compensation. Unaliased, real-time two dimensional (2D) images are acquired continuously of the anatomy of interest. The images are compared to at least one template to using a correlation coefficient technique to select images corresponding to minimal motion and distortion. A spatial grid of templates can be used to cover an anatomy of interest. Multiple temporal templates can be used to create a time series of magnetic resonance (MR) images. The selected images are used to provide a high-resolution image, preferably a three dimensional (3D) image.

11 Claims, 8 Drawing Sheets

OTHER PUBLICATIONS

Luk–Pat, G., 8th Proceeding, ISMRM, p. 1627, 2000.
McKinnon, G., Magnetic Resonance In Medicine, vol. 30, pp. 609–616, 1993.
Pruessmann, K., et.al., 6th Proceeding, ISMRM, p. 579, 1998.
Spielman, D., et.al., Magnetic Resonance in Medicine, vol. 34, pp. 388–394, 1993.
Spraggins, T., Magnetic Resonance Imaging, pp. 675–681, 1990.
Sussman, M., et.al., 7th Proceeding, ISMRM, p. 1267, 1999.
Sussman, M., et.al., 7th Proceeding, ISMRM, pp. 2003.
Sussman, M., et.al., 8th Proceeding, ISMRM, p. 1703, 2000.
Thedens, D., et.al., 7th Proceeding, ISMRM, p. 22, 1999.
Wang, Y., et.al., Journal of Magnetic Resonance Imaging, vol. 11, pp. 208–214, 2000.
Wang, Y., et al., Magnetic Resonance in Medicine, vol. 33, pp. 713–719, 1995.
Wood, M., et al., Medical Physics, vol. 12, pp. 143–151 1985.
Zhang, Y., et.al., Magnetic Resonance In Medicine, vol. 39, pp. 999–1004, 1998.

* cited by examiner

MAGNETIC RESONANCE IMAGING USING DIRECT, CONTINUOUS REAL-TIME IMAGING FOR MOTION COMPENSATION

BACKGROUND OF THE INVENTION

The field of the invention is nuclear magnetic resonance imaging methods and systems. More particularly, the invention relates to the reduction of image artifacts caused by patent motion during an MRI scan.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "dipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Acquiring magnetic resonance (MR) images may require a time period of seconds to minutes. Over this period, significant anatomical motion may occur—specifically, cardiac- and respiratory-induced motion. This motion produces artifacts that may significantly degrade image quality. A number of different techniques have been developed in order to compensate for the effects of this motion. These techniques attempt to either acquire data during periods of minimal motion, or to correct for the effects of motion when it does occur. For these techniques to compensate for the effects of motion, the motion itself must be known accurately throughout the data acquisition. In the past, bellows and navigator echoes placed on the diaphragm have been used to determine respiratory-induced motion. A shortcoming of this approach is that diaphragm position may not accurately reflect respiratory-induced motion at anatomy remote from the diaphragm. For cardiac-induced motion, ECG-waveforms have been used. The problem with ECG waveforms is that there may be substantial variation from one cardiac cycle to the next, particularly in patient populations. Consequently, the cardiac position may correspondingly vary from one cycle to the next. Overall, the drawback with previous motion compensation techniques is that they rely on indirect measures to infer the motion of the anatomy under investigation.

In an attempt to overcome these difficulties, there have been a number of attempts to utilize information from the acquired data simultaneously for motion compensation purposes. One technique extracts phase information from the central portion of spiral interleaves to detect in-plane spatial shifts of the anatomy. A similar approach has been developed using individual k-space lines. The problem with these approaches is that they require the assumption of rigid-body anatomical motion. This is a questionable assumption for respiratory-induced motion and an invalid one for cardiac-induced motion.

Recently, an adaptive averaging technique has been introduced that combines a real-time series of aliased, EPI images to produce a high signal-to-noise ratio (SNR), high-resolution image. In this technique, motion compensation is accomplished by utilizing data acquired only during periods of minimal motion. Such periods are identified by applying the cross-correlation template matching technique to each individual image frame. The advantage of this approach is that motion compensation is accomplished through a direct visualization of the anatomy. The disadvantage of this technique is that the resolution is limited by the amount of aliasing that is tolerable in the real-time EPI images. Also, at present, the identification of the optimal data acquisition periods is done in a semi-quantitative manner. Finally, this technique is restricted to two-dimensional (2D) imaging.

BRIEF SUMMARY OF THE INVENTION

A method and system for performing magnetic resonance imaging uses direct, continuous, unaliased, real-time imaging for motion compensation. This technique includes acquisition of unaliased, real-time 2D images continuously of the anatomy of interest. Periods of minimal motion and distortion are identified by applying a correlation coefficient (CC) technique to the real-time series. Multiple spatial templates can be used to increase the efficiency of the technique without sacrificing anatomical coverage. Multiple temporal templates can be used to create a time sequence series of MR images. Other MR data acquired as part of the real-time data acquisition can be used to generate an MR image with additional information over and above that contained in the real-time images including, but not limited to, high resolution and 3D information

DETAILED DESCRIPTION OF THE INVENTION

Figure 1:
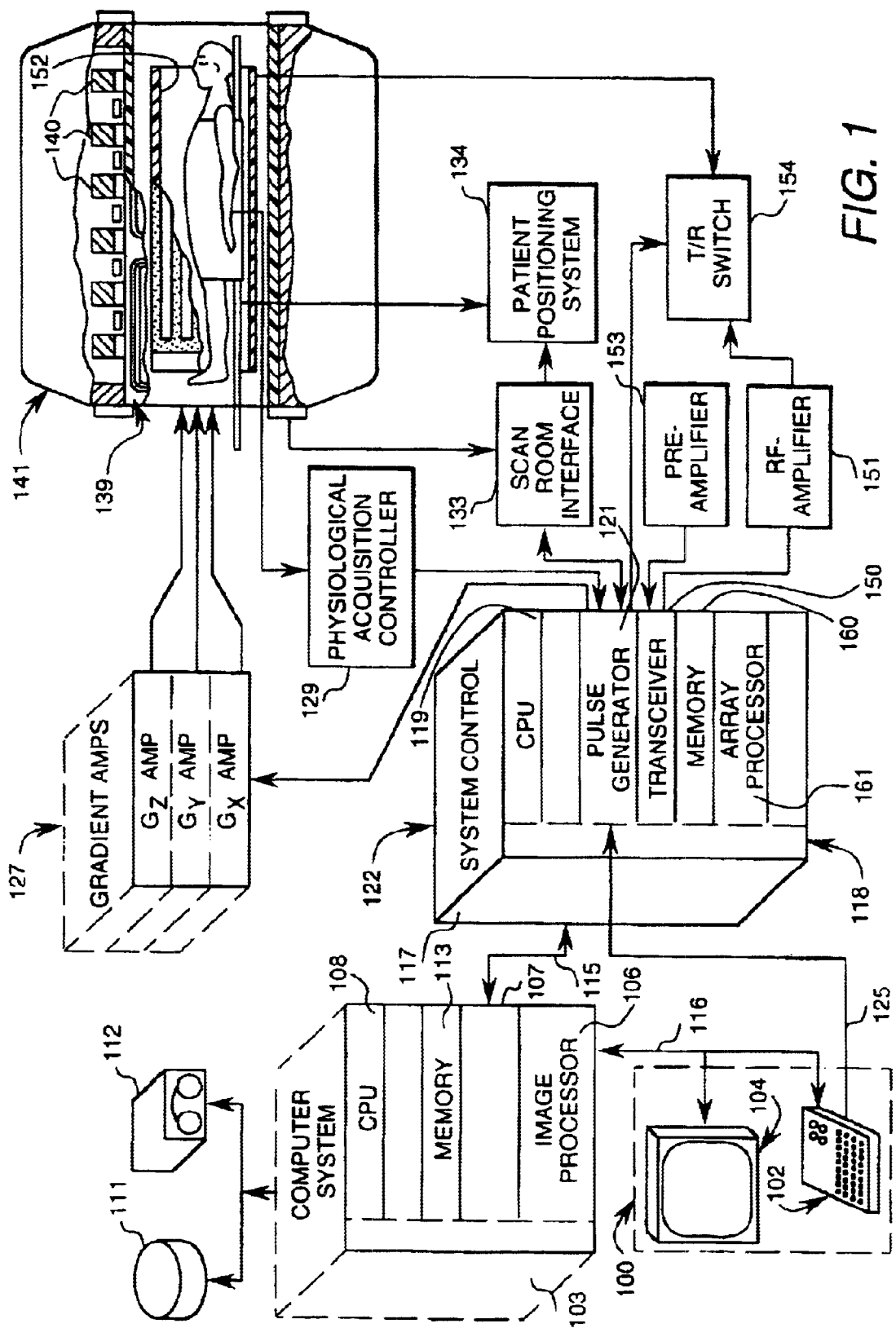
FIG. 1 is block diagram of a system according to the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes attached to the patient. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$ $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a surface coil) to be used in either the transmit or receive mode.

The NMR signals picked up by the RF coil 152 are digitized by the transceiver module 150 and transferred to a memory module 160 in the system control 122. When the scan is completed and an array of raw k-space data has been acquired in the memory module 160. This raw k-space data may be rearranged into separate k-space data arrays for each cardiac phase image (or other images) to be reconstructed, and each of these is input to an array processor 161 which operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104. For a more detailed description of the transceiver 150, reference is made to U.S. Pat. Nos. 4,952,877 and 4,992,736 which are incorporated herein by reference. More details about various aspects of the system can be found in U.S. Pat. No. 6,144,200, hereby also incorporated by reference, whereas the description that follows will concentrate on features that are new.

The present invention involves a technique for acquiring MR images using direct, continuous visualization of the anatomy for motion compensation. The basis of this technique is the acquisition of a series of 2D, real-time images of the anatomy. These images will be used for two purposes: First, an analysis of these images will provide the information used for motion compensation. Second, by combining the real-time images together in conjunction with other data, MR images with additional information (e.g. high resolution) can be generated.

Significantly, and as will be described in detail below, the 2D, real-time images are direct (meaning "unaliased") images of the anatomy of interest, not some nearby anatomical feature. For example, if the anatomy of interest is a coronary artery, the 2D, real-time images will be of the coronary artery itself, not images of another feature (e.g., the heart outer wall) that would be used to infer the motion of the coronary artery.

Motion compensation can be accomplished by applying the correlation coefficient template matching technique to each 2D real-time image. This process identifies data periods where no anatomical motion or distortion has occurred. By utilizing only data acquired during these periods, the effects of motion and distortion can be minimized.

MR images with additional information (over and above that contained in the 2D real-time images) can be generated by combining selective real-time images together with other data acquired as part of the real-time data acquisition. The combined data may be used to generate MR images with information including, but not limited to, higher resolution, and three-dimensional (3D) information.

Real-time images can be acquired using any k-space trajectory including, but not limited to, spirals, EPI, SMASH, and SENSE.

Figure 2:
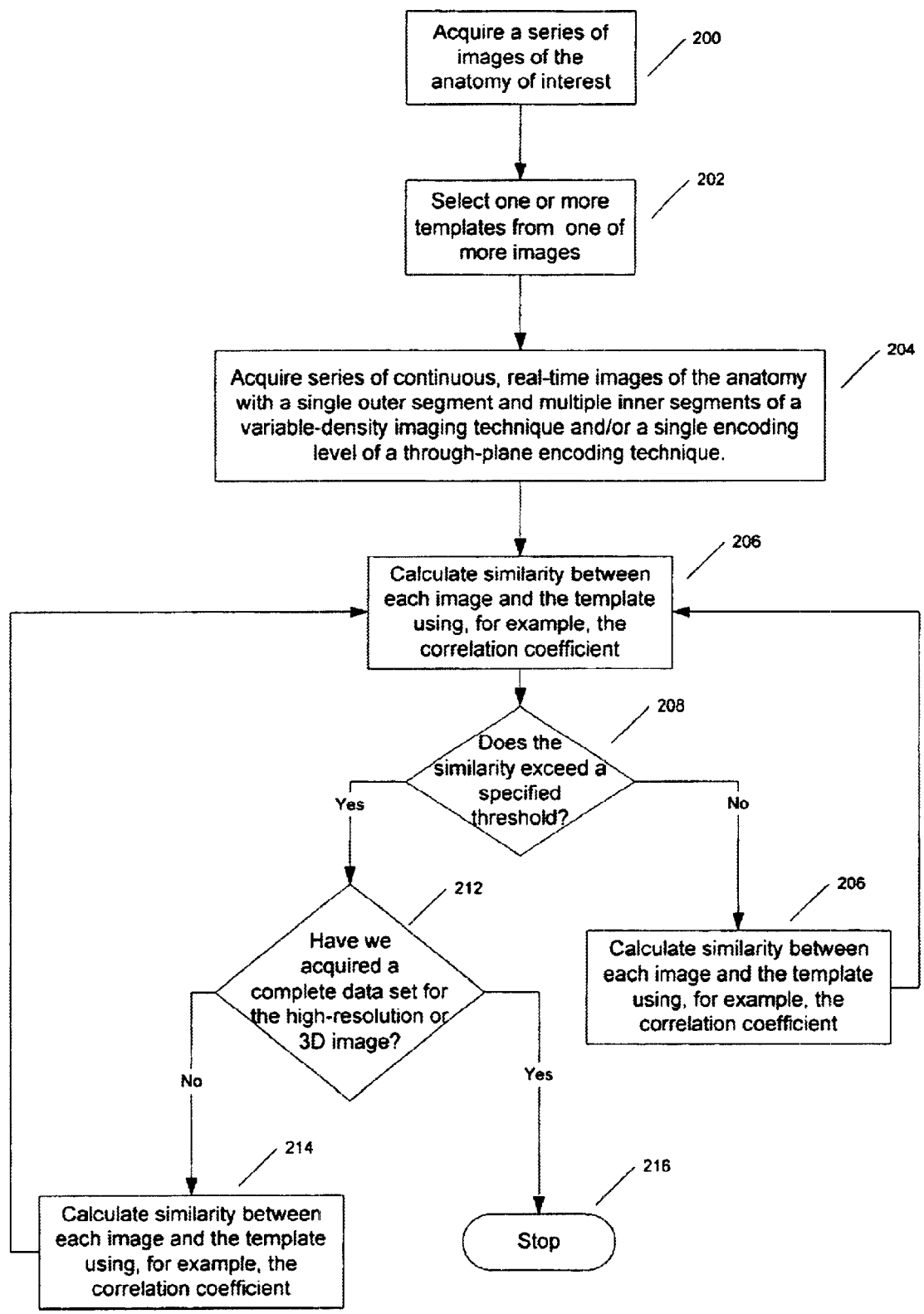
FIG. 2 is a simplified flow chart of the method of the present invention.

Turning now to FIG. 2, the motion compensation technique of the present invention will be described. At block 200, a series of 2D, real-time direct images of an anatomy of interest are acquired. At block 202, one or more templates are selected from one or more of the images. Next, block 204 involves acquiring a series of continuous, real-time images of the anatomy with a single outer segment and multiple inner segments of a variable-density imaging technique and/or a single encoding level of a through-plane encoding technique. These alternate approaches for block 204 will be described below.

At block 206, the similarity between each image and the template is calculated, for example, using the correlation coefficient, At block 208, a test is performed to determine if the similarity exceeds a threshold.

If block 208 determines that the similarity does not exceed the threshold, block 210 then continues acquiring a series of continuous, real-time images of the anatomy using the same single outer segment and multiple inner segments of a variable-density imaging technique and/or the same single encoding level of a through-plane encoding technique as in block 206. Block 210 returns to block 206.

If block 208 determines that the similarity is at or above the threshold, block 212 would check if a complete data set for the high-resolution or 3D image has been obtained. If not, control goes to block 214 for acquisition of a series of continuous, real-time images of the anatomy using a different (i.e., from that in block 204) single outer segment and multiple inner segments of a variable-density imaging technique and/or a different (i.e., from that in block 204) single encoding level of a through-plane encoding technique. Block 214 leads back to block 206.

If block 212 determines that a complete data set for the high-resolution or 3D image has been obtained, control goes to the stop block 216.

Figure 3C:
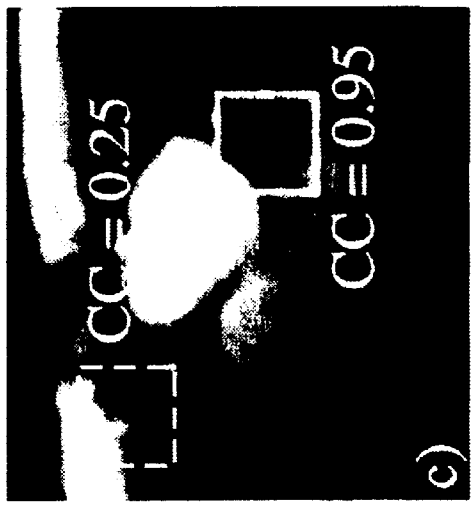
FIGS. 3(a) to 3(e) are various photomicrographs that will be used to explain the invention.
Figure 3B:
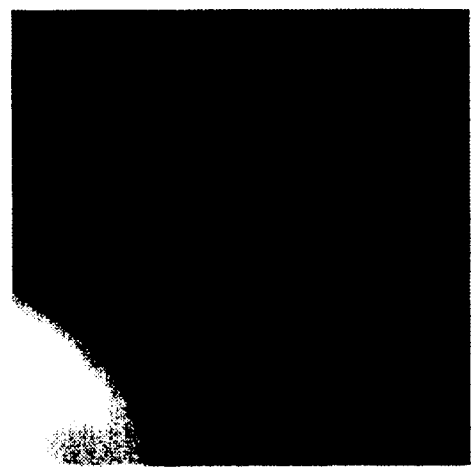
Figure 3E:
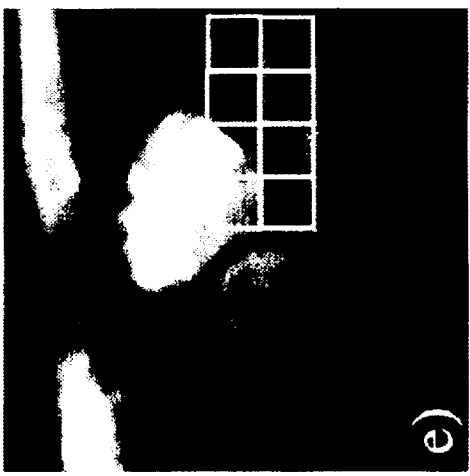
Figure 3A:
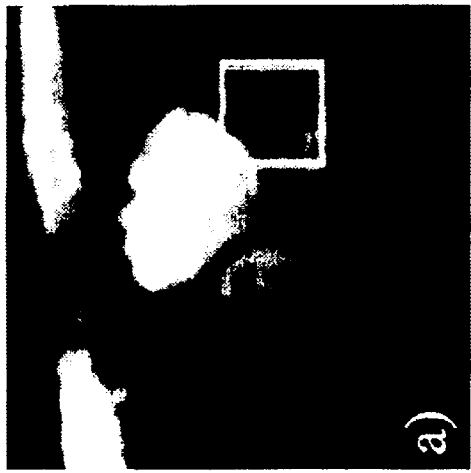
Figure 3D:
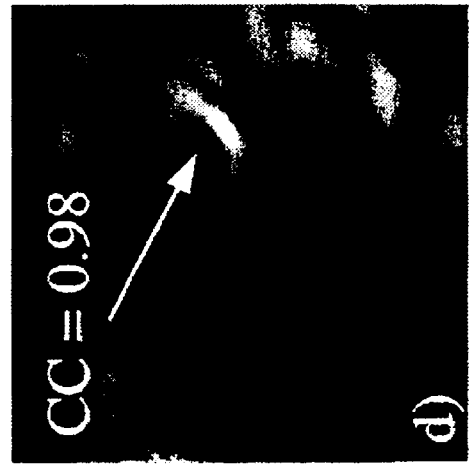

Turning now to FIGS. 3A to 3E, further explanation of the template matching technique will be presented using the correlation coefficient (CC) template matching technique applied to the left coronary artery (LCA). FIG. 3A is an initial image containing a template region in the white box. FIG. 3B is a zoomed-in or enlarged view of the template. FIG. 3C illustrates how the correlation coefficient (CC) is calculated between the template and different regions of a subsequent image (two locations are indicated). The larger the CC value, the greater the similarity. FIG. 3D is the image of the CC at every location in the image. The maximum value of the CC (CCmax) is the location of the template in the image. FIG. 3E is a 4×2 grid of templates. Using the grid, smaller templates can be used without sacrificing the range of anatomical coverage. In this case, the entire left coronary artery can be covered. The CC values for each template grid element must be calculated separately.

Individual images are analyzed using the correlation coefficient (CC) template matching technique. With this technique, an initial real-time image containing the anatomy of interest must be selected. From this image, a template consisting of a subregion of the image is extracted. The CC between the template and every location in every image in the real-time series is calculated (FIGS. 3C and 3D). This provides two pieces of information: First, the location of the maximum value of the CC in each image (=CCmax) is the location of the template in that image. Second, the value CCmax represents the degree of similarity between the image and template. The larger CCmax, the greater the similarity (up to a maximum of unity for identity). This information can be used to select data periods in which minimal motion or distortion, relative to the template, has occurred. Specifically, data will be utilized only if the corresponding image acquired during that period satisfies two criteria. First, there is limited displacement between the image and the template. Second, the CCmax value is larger than a pre-determined cutoff value As an example, one possibility is to set the cutoff CCmax value to the value expected when the image and template are identical within noise. It can be shown, with a u % confidence level, that this value is given by:

$$CC_{max} = \tan h\{\tan h^{-1}\{<CC_{max}>\} + \Phi_{cc} + \sigma_{cc} Z_u\}$$

where:
$<CC_{max}> = 1 - (\sigma_n/\sigma_f)^2$
$\Phi_{cc} = <CC_{max}>/[2(N \cdot M - 1)]$
$\sigma_{cc} = 1/\sqrt{N \cdot M - 3}$ where Zu is the Gaussian Z-score corresponding to a u % confidence level, at is the standard deviation of the pixels in the template, and N, M are the x and y template dimensions.

In anatomical regions where motion is relatively rigid (e.g. the brain), the technique should perform well. However, the efficiency of the technique will likely be substantially reduced in areas undergoing significant non-rigid body motion (e.g. the heart) since only a small percentage of images would likely satisfy both selection criteria. A potential method of improving the efficiency is to use smaller templates. Over the reduced portion of anatomy covered by a smaller template, rigid body motion is more likely to occur. However, the entire anatomy of interest may not be covered by a smaller template. In this case, motion artifacts may be introduced into these areas. A remedy to this situation is to use a grid of templates (FIG. 3E). In this case, the individual grid elements could be analyzed separately. Correspondingly, different data periods could then be used to reconstruct different parts of the final, high-resolution and/or 3D image.

Through the use of multiple templates spanning a region of the image, a single, motion compensated image can be generated from a series of 2D real-time images. By extending this procedure to include multiple templates in time, multiple, motion compensated MR images can be generated. This is accomplished by using a series of templates extracted from a temporal sequence of real-time images.

In addition to using the real-time images for motion compensation, they can be used in conjunction with other data to provide MR images with additional information. The additional information may include, but not be limited to, higher resolution, and 3D information. To accomplish this, the fundamental assumption that is made is that additional information can be acquired as part of the real-time data acquisition without substantially affecting the appearance of the real-time images. In the sections below, the examples of higher resolution, and 3D information are presented.

To generate high-resolution images, the approach taken here is to use a generalized variable density k-space acquisition. With this technique, the low-resolution, unaliased, real-time images are generated from a small number of high k-space density acquisitions of the low spatial frequencies. During each of these acquisitions, a small amount of higher resolution information is gathered through a low k-space density acquisition of some of the higher spatial frequencies. Since the higher spatial frequencies are acquired at a lower k-space density than the low spatial frequencies, more data accusations will be required to generate the full high-resolution images than the low-resolution ones. Therefore, while the unaliased, low-resolution images can e acquired in real-time, data for the full high-resolution images cannot. In fact, high-resolution images generally require a data acquisition period that is long compared with anatomical motion. However, the effects of motion can be minimized by applying the CC technique to the low-resolution images to identify the data periods where minimal motion and/or distortion has occurred. By combining the data (both low and high spatial frequencies) from these periods, a high-resolution image can be generated with minimal motion artifacts.

Figure 4:
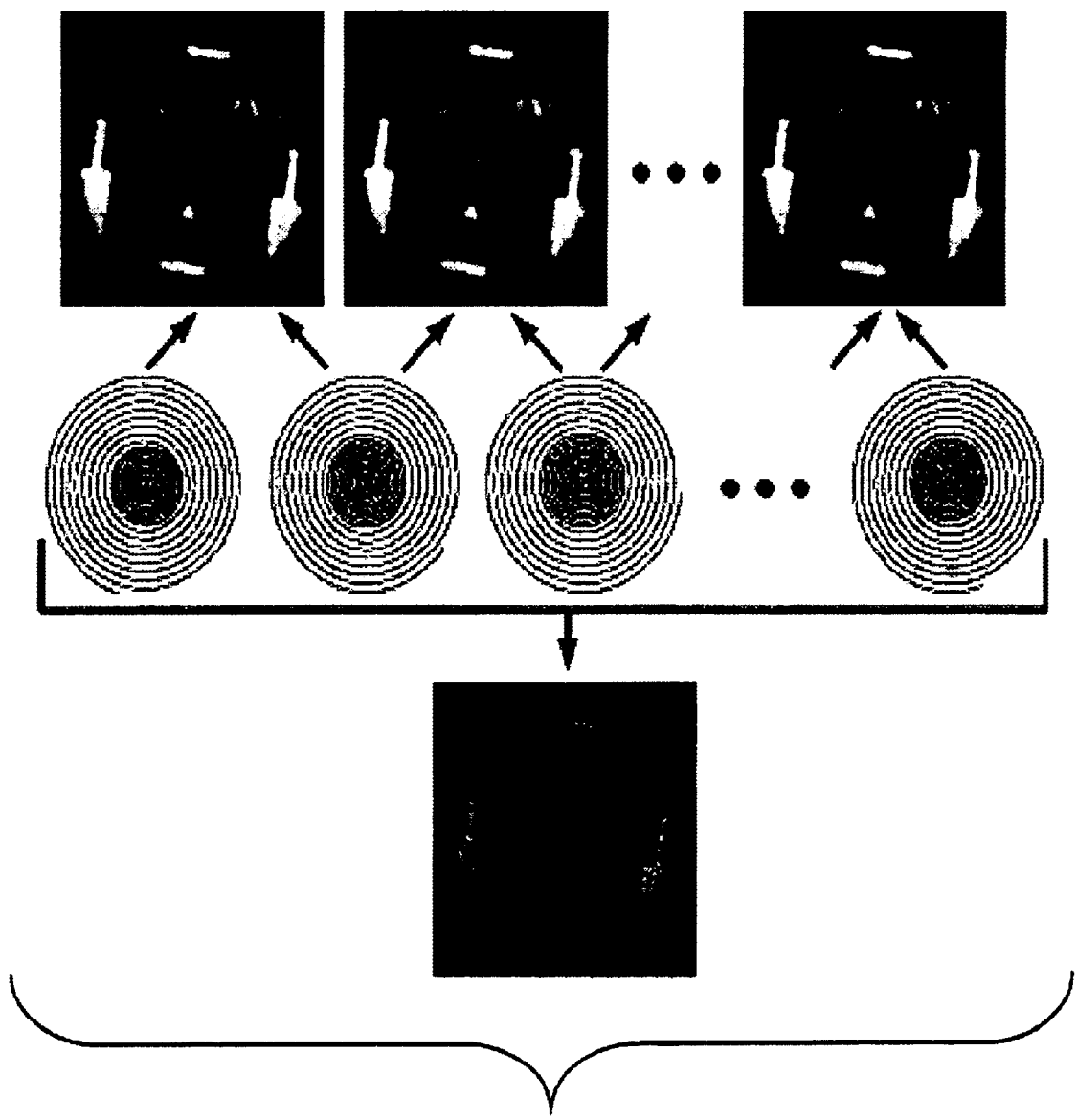
FIG. 4 shows a variable-density spiral acquisition according to the present invention.
Figure 5:
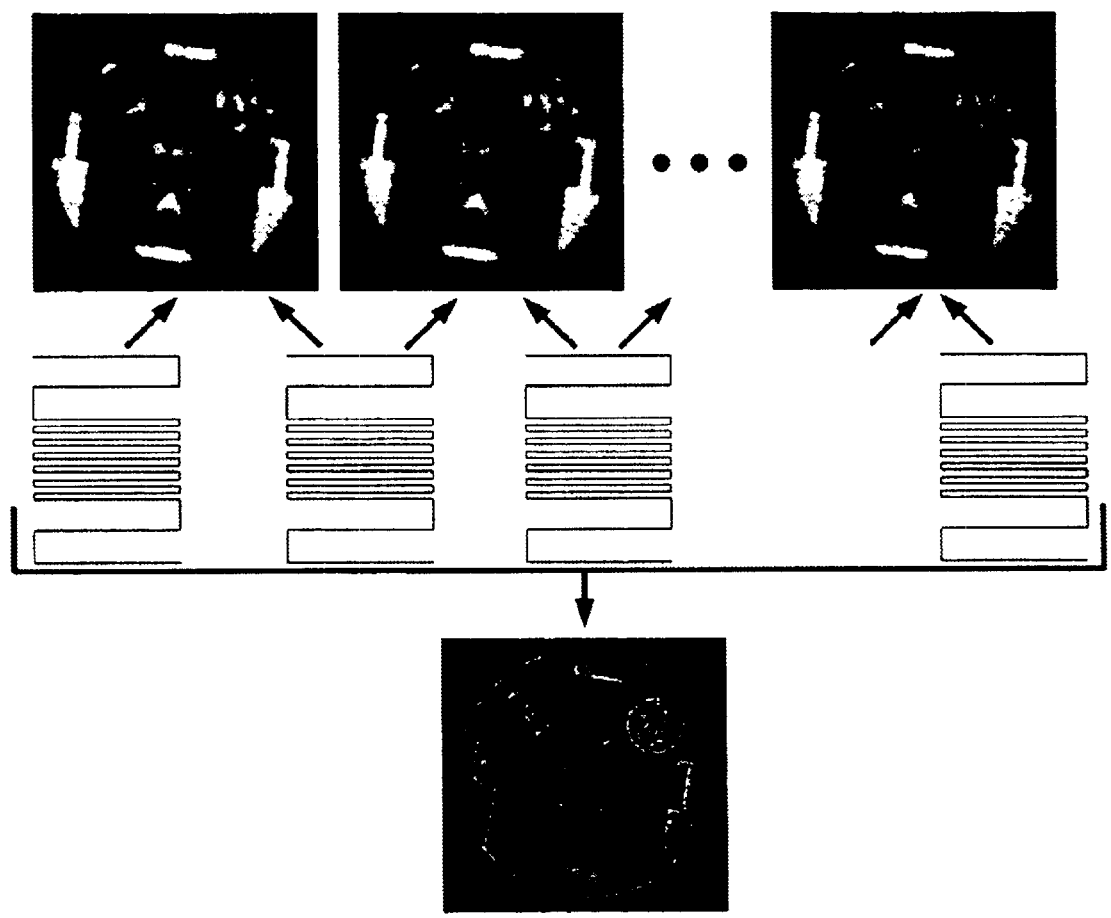
FIG. 5 shows a variable-density echo-planer image (EPI) according to the present invention.

The particular nature of the variable-density acquisition is unimportant. As an example, a variable-density spiral acquisition is indicated in FIG. 4. The central (high density) part of the k-space trajectory is used to form the images. Another possible approach is variable-density echo-planar image (EPI) imaging as shown in FIG. 5. In fact, other variable-density trajectories could be used.

Figure 6:
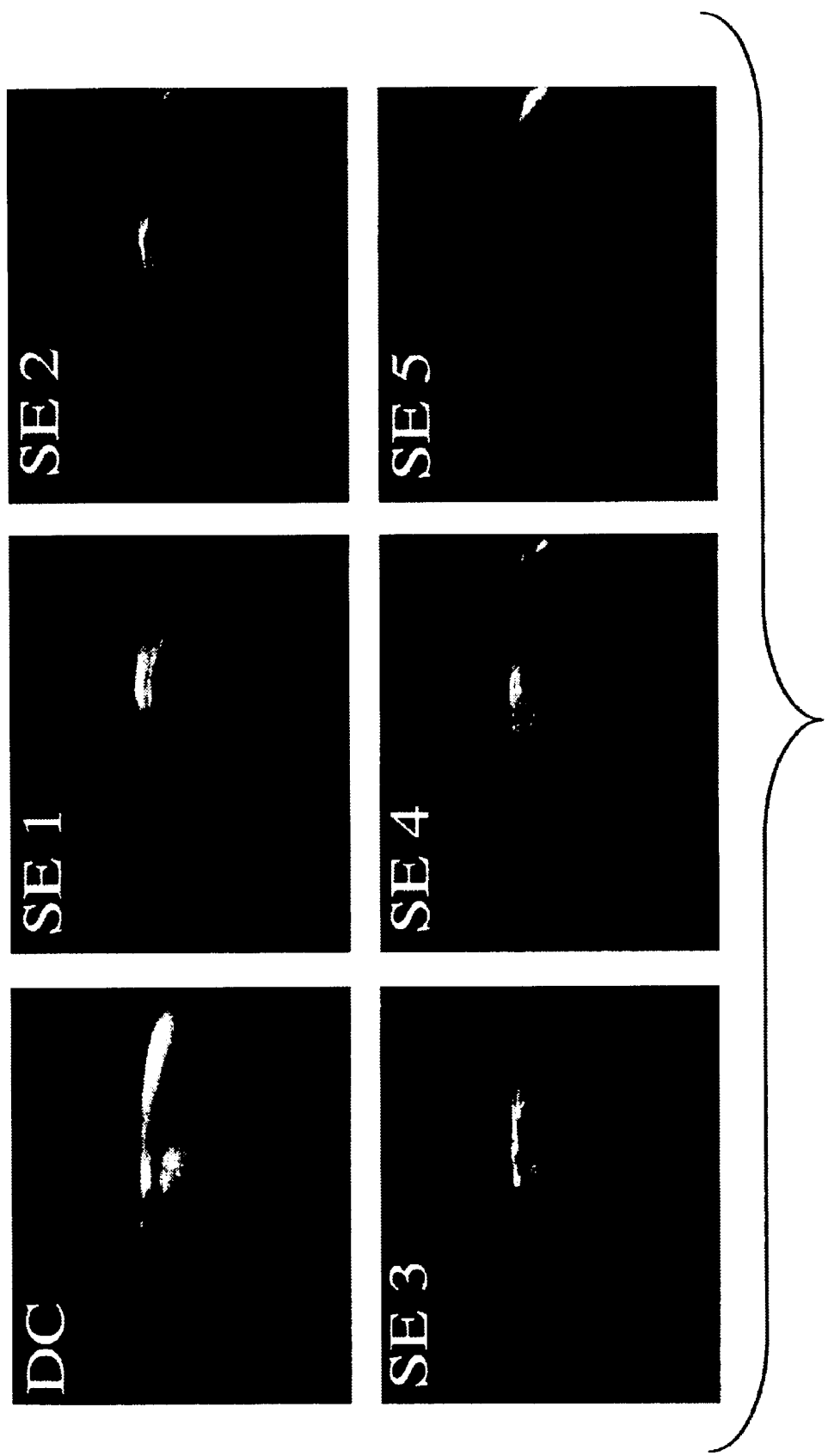
FIG. 6 shows the Fourier basis images used for multi-slice encoding.

Three-dimensional information can be generated by encoding the third dimension information concurrently with the acquisition of the two-dimensional real-time images. Possible methods for encoding the third dimension may include, but not be limited to, 3D Fourier encoding, Hadamard encoding, or multi-band encoding using an encoding matrix other than the Hadamard matrix, such as the Discrete Fourier transform (DFT) matrix. The major assumption that is made is that, if in-plane images are reconstructed in the presence of through-plane encoding, the gross structure in the image will not be substantially affected. If this assumption is valid, then the CC technique can be applied to the in-plane images, and motion compensation can proceed as described previously. As an example, FIG. 6 represents the different basis images used in a DFT multi-band encoding of the heart. The Fourier basis functions begin with the DC component and proceed to higher slice encode (SE) orders SE1 to SE5. When added together in an appropriate manner, they will produce images of six adjacent slices (not shown).

Figure 7:
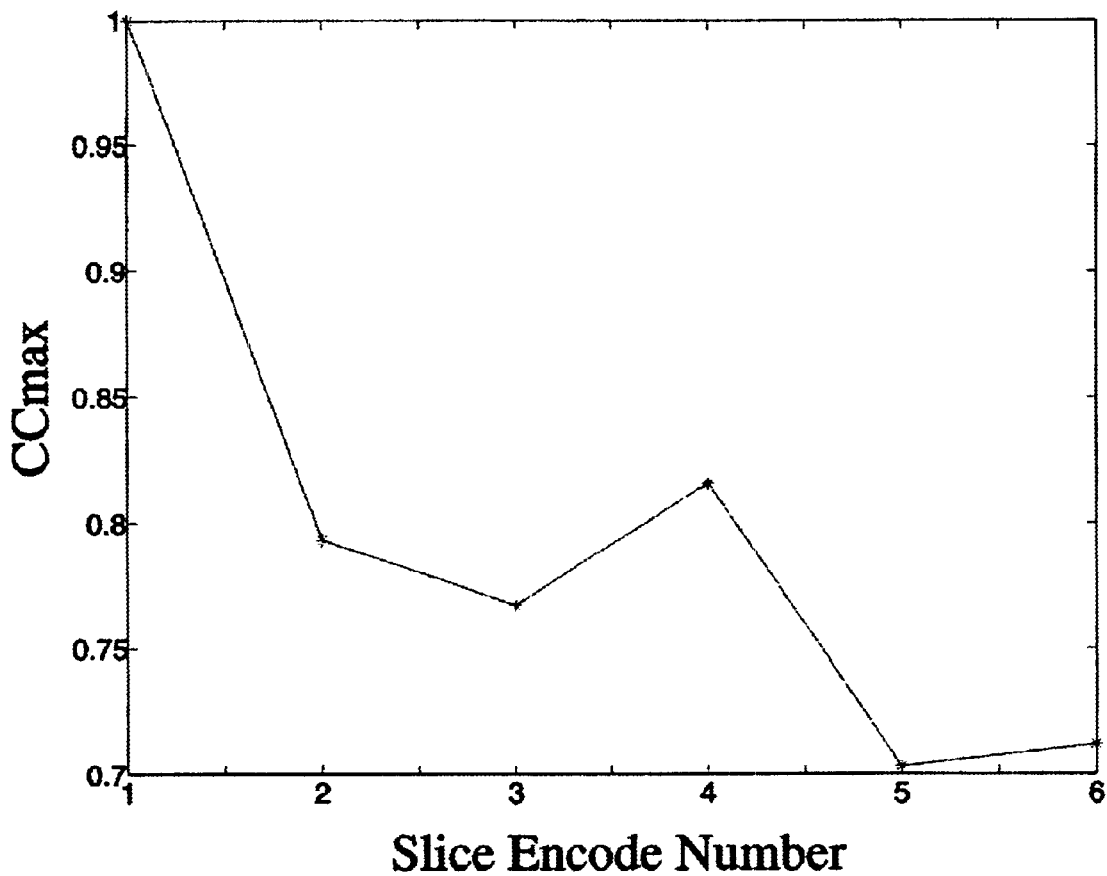
FIG. 7 is a graph of the correlation coefficient maximum ($CC_{max}$) values between the DC and the higher basis function images of FIG. 6.

Although the details of the anatomy differ in the different basis images, the gross morphology of the heart is clearly visible in all. To quantify this point, FIG. 7 indicates the CCmax values of the basis images relative to the DC basis image. There is significant correlation between the different basis images indicating substantial similarity. Consequently, although slice encoding does affect the appearance of the in-plane images, enough similarity exists to apply the CC technique for motion compensation.

Figure 8A:
FIGS. 8A to 8D are photomicrographs illustrating images obtained with the present invention.
Figure 8B:
Figure 8C:
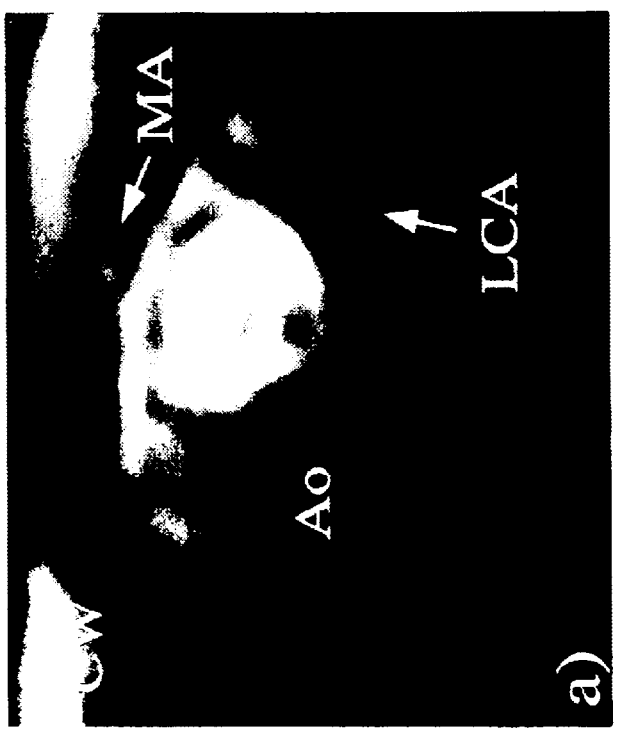
Figure 8D:
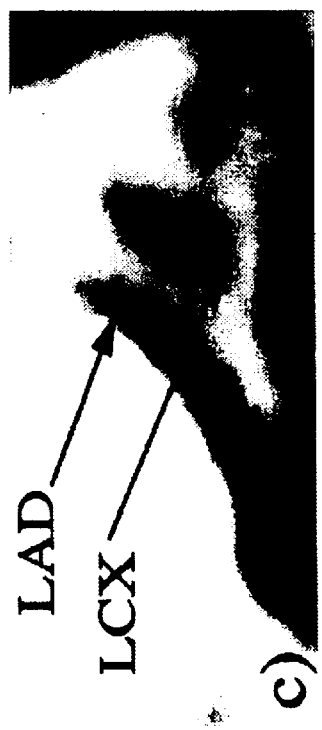

FIGS. 8A to 8D are the results of applying a variable-density spiral acquisition (FIG. 4) to the left coronary artery (LCA) for the purpose of high resolution. The data from the inner spiral images was used to identify data periods of minimal motion and distortion. Using data from these periods, a high-resolution image FIG. 8D was constructed. FIG. 8A is an inner spiral, low-resolution real-time image (3.4 mm resolution). FIG. 8B is a full variable-density spiral image (1.1 mm resolution). FIGS. 8C and 8C are respective zoomed-in view of the LCA in images of FIGS. 8A and 8B. The labels in these figures are: CW=chest wall, Ao=aorta, MA=mammary artery, LAD=left anterior descending artery. The effectiveness of the motion compensation is demonstrated by the lack of blurring in the high resolution image FIG. 8D.

Important features of the present invention include the use of real-time, unaliased 2D images for motion compensation. Other quite significant features of the invention in its various aspects include: the use of variable-density EPI trajectories for high-resolution MR images; the use of through-plane encoded images for motion compensation during a 3D acquisition; the use of the CC technique to identify images with minimal motion and distortion; the use of a template grid matching technique for MR images; and the use of a temporal series of templates to produce a time series of motion compensated MR images.

An method for performing magnetic resonance imaging using direct, continuous, unaliased, real-time imaging for motion compensation has been described. This technique consists of the following elements:

1. Unaliased, real-time 2D images are acquired continuously of the anatomy of interest.
2. Periods of minimal motion and distortion are identified by applying the CC technique to the real-time series.
3. Multiple spatial templates can be used to increase the efficiency of the technique without sacrificing anatomical coverage.
4. Multiple temporal templates can be used to create a series of MR images.
5. Other MR data acquired as part of the real-time data acquisition can be used to generate an MR image with additional information over and above that contained in the real-time images including, but not limited to, high resolution and 3D information.

What is claimed is:

1. A method of magnetic resonance imaging (MRI) with motion compensation, the steps comprising:
    selecting at least one template from real-time 2D magnetic resonance (MR) images of an anatomy of interest;
    subjecting the anatomy of interest to MRI to acquire a series of unaliased real-time 2D images;
    selecting multiple images from among the series of unaliased 2D images that minimize motion-induced artifacts by comparing images from the series of unaliased 2D images to the at least one template;
    forming an output image of the anatomy of interest using the selected multiple images such that motion-induced artifacts are minimized.

2. The method of magnetic resonance imaging (MRI) with motion compensation of claim 1 wherein the step of selecting multiple images compares images to the at least one template using a correlation coefficient.

3. The method of magnetic resonance imaging (MRI) with motion compensation of claim 2 wherein the series of unaliased real-time 2D images are acquired by using variable-density image acquisition.

4. The method of magnetic resonance imaging (MRI) with motion compensation of claim 1 wherein the output image is a 3D image.

5. The method of magnetic resonance imaging (MRI) with motion compensation of claim 4 wherein the selecting of at least one template step includes selecting a spatial grid of templates, each template being used in the comparison.

6. The method of magnetic resonance imaging (MRI) with motion compensation of claim 4 wherein the selecting of at least one template step includes selecting a temporal series of templates, each template being used in the comparison, and further comprising the step of using the temporal series of templates to produce a time series of motion compensated magnetic resonance images.

7. The method of magnetic resonance imaging (MRI) with motion compensation of claim 1 wherein the selecting of at least one template step includes selecting a spatial grid of templates, each template being used in the comparison.

8. The method of magnetic resonance imaging (MRI) with motion compensation of claim 6 wherein the selecting of at least one template step includes selecting a temporal series of templates, each template being used in the comparison, and further comprising the step of using the temporal series of templates to produce a time series of motion compensated magnetic resonance images.

9. The method of magnetic resonance imaging (MRI) with motion compensation of claim 2 wherein only those images selected from among the series of unaliased real-time 2-D images are used to form the output image.

10. The method of magnetic resonance imaging (MRI) with motion compensation of claim 1 wherein the series of unaliased real-time images are acquired using through-plane encoding.

11. The method of magnetic resonance imaging (MRI) with motion compensation of claim 1 wherein the selecting of the at least one template includes selecting multiple templates, the multiple templates selected from the group consisting of: multiple spatial templates and multiple temporal templates.

* * * * *